United States Patent
Wang et al.

(10) Patent No.: US 10,581,018 B2
(45) Date of Patent: Mar. 3, 2020

(54) ORGANIC LIGHT-EMITTING DISPLAY PANEL AND DISPLAY APPARATUS EACH HAVING SECOND PACKAGING FILM FORMED IN OPENINGS OF FIRST PACKAGING FILM FOR BLOCKING WATER AND OXYGEN AND FABRICATION METHOD OF THE ORGANIC LIGHT-EMITTING DISPLAY PANEL

(71) Applicant: BOE TECHNOLOGY GROUP CO., LTD., Beijing (CN)

(72) Inventors: Linlin Wang, Beijing (CN); Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/986,984

(22) Filed: May 23, 2018

(65) Prior Publication Data

US 2019/0097172 A1 Mar. 28, 2019

(30) Foreign Application Priority Data

Sep. 27, 2017 (CN) .......................... 2017 1 0888921

(51) Int. Cl.
*H01L 51/52* (2006.01)
*H01L 51/56* (2006.01)

(52) U.S. Cl.
CPC ........ *H01L 51/5259* (2013.01); *H01L 51/525* (2013.01); *H01L 51/5237* (2013.01);
(Continued)

(58) Field of Classification Search
CPC ............. H01L 51/5253; H01L 51/5259; H01L 51/5237; H01L 51/5246; H01L 51/525
See application file for complete search history.

(56) References Cited

U.S. PATENT DOCUMENTS

| | | | |
|---|---|---|---|
| 9,123,911 B2 | 9/2015 | Kim et al. | |
| 2005/0269926 A1* | 12/2005 | Fukuoka | H01L 51/5246 313/123 |

(Continued)

FOREIGN PATENT DOCUMENTS

| | | |
|---|---|---|
| CN | 104124258 A | 10/2014 |
| CN | 104733507 A | 6/2015 |

(Continued)

OTHER PUBLICATIONS

Chinese Office Action in Chinese Application No. 201710888921.X, dated Nov. 5, 2018, with English translation.

(Continued)

*Primary Examiner* — Michael Jung
(74) *Attorney, Agent, or Firm* — Collard & Roe, P.C.

(57) ABSTRACT

An organic light-emitting display panel and a fabrication method thereof, and a display apparatus are provided. The organic light-emitting display panel has a display region and a non-display region surrounding the display region in a plan view and includes: a base substrate; a plurality of Organic Light-emitting Diode (OLED) devices, located on the base substrate and in the display region; and a first packaging film, located in both the display region and the non-display region, wherein the plurality of OLED devices are located between the first packaging film and the base substrate, and at least one opening is located in the first packaging film.

20 Claims, 7 Drawing Sheets

(52) U.S. Cl.
CPC ...... *H01L 51/5246* (2013.01); *H01L 51/5253* (2013.01); *H01L 51/56* (2013.01); *H01L 2251/558* (2013.01)

(56) References Cited

U.S. PATENT DOCUMENTS

| | | | |
|---|---|---|---|
| 2012/0256202 A1 | 10/2012 | Lee et al. | |
| 2013/0049580 A1* | 2/2013 | Maindron | H01L 51/56 313/512 |
| 2014/0319474 A1* | 10/2014 | Kim | H01L 51/5256 257/40 |
| 2016/0079564 A1* | 3/2016 | Shim | H01L 51/5256 257/40 |
| 2017/0040392 A1 | 2/2017 | Wang et al. | |
| 2017/0155081 A1 | 6/2017 | Zeng et al. | |
| 2017/0179422 A1* | 6/2017 | Jung | H01L 27/323 |
| 2017/0373128 A1* | 12/2017 | Lee | H01L 27/3258 |
| 2018/0006267 A1* | 1/2018 | Sakamoto | H01L 27/3246 |
| 2018/0309088 A1 | 10/2018 | Gong et al. | |

FOREIGN PATENT DOCUMENTS

| | | |
|---|---|---|
| CN | 105118933 A | 12/2015 |
| CN | 106848106 A | 6/2017 |

OTHER PUBLICATIONS

Chinese Office Action in Chinese Application No. 201710888921.X, dated Jun. 17, 2019 with English translation.

* cited by examiner

ORGANIC LIGHT-EMITTING DISPLAY PANEL AND DISPLAY APPARATUS EACH HAVING SECOND PACKAGING FILM FORMED IN OPENINGS OF FIRST PACKAGING FILM FOR BLOCKING WATER AND OXYGEN AND FABRICATION METHOD OF THE ORGANIC LIGHT-EMITTING DISPLAY PANEL

The present application claims priority of the Chinese Patent Application No. 201710888921.X filed on Sep. 27, 2017, the disclosure of which are incorporated herein by its reference in its entirety as part of the present application.

TECHNICAL FIELD

Embodiments of the present disclosure relate to an organic light-emitting display panel and a fabrication method thereof, and a display apparatus.

BACKGROUND

Packaging of an Organic Light-emitting Diode (OLED) display device mainly aims to block corrosion of water and oxygen to the OLED device by utilizing film packaging or packaging glue, and OLED packaging technologies are roughly divided into glass packaging and film packaging. For film packaging, a demand for water and oxygen blocking on an LED is very important. However, a current film packaging effect is still not very ideal.

Therefore, a further study on film packaging needs to be carried out.

SUMMARY

An embodiment of the present disclosure provides an organic light-emitting display panel with a display region and a non-display region surrounding the display region in a plan view, including: a base substrate; a plurality of Organic Light-emitting Diode (OLED) devices, located on the base substrate and in the display region; and a first packaging film, located in both the display region and the non-display region, wherein the plurality of OLED devices are located between the first packaging film and the base substrate, and at least one opening is located in the first packaging film.

For example, in a direction perpendicular to the base substrate, the at least one opening runs through the first packaging film.

For example, the at least one opening divides the first packaging film into at least two sub portions, and the at least two sub portions are made of a same material and separated from each other.

For example, in the plan view, the at least one opening is of a strip shape, and at least a portion of the at least one opening is in parallel to an edge of the display region of the organic light-emitting display panel.

For example, the organic light-emitting display panel further includes a second packaging film, wherein at least a part of the second packaging film is filled in the at least one opening.

For example, the at least one opening is located in the non-display region.

For example, in the direction perpendicular to the base substrate, the second packaging film extends to outside of the opening.

For example, both the first packaging film and the second packaging film are inorganic films.

For example, a thickness of the second packaging film is greater than that of the first packaging film, and a desiccant is arranged on one side of the first packaging film, which faces away from the base substrate.

For example, the thickness of the second packaging film is 1.6 to 2.4 micrometers; the thickness of the first packaging film is 0.6 to 1.4 micrometers.

For example, the organic light-emitting display panel further includes a third packaging film, the third packaging film covering the first packaging film and the second packaging film, and the third packaging film being an organic film or a laminated layer of a plurality of organic films and a plurality of inorganic films.

Another embodiment of the present disclosure provides a method for fabricating an organic light-emitting display panel with a display region and a non-display region surrounding the display region in a plan view, including: forming a plurality of OLED devices on a base substrate and in the display region; and forming a first packaging film on the base substrate, the first packaging film being located in the display region and the non-display region, at least one opening being formed in the first packaging film.

For example, the method further includes forming a second packaging film in the at least one opening.

For example, in a direction perpendicular to the base substrate, a thickness of the second packaging film is greater than that of the first packaging film, the method further includes: providing a desiccant on a side of the first packaging film facing away from the base substrate.

Yet another embodiment of the present disclosure provides a display apparatus, including the organic light-emitting display panel described above.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure, but not limitative of the disclosure.

FIG. 1 is a structural schematic diagram of an organic light-emitting display panel in an embodiment of the present disclosure.

DETAILED DESCRIPTION

In order to make objects, technical solutions and advantages of the embodiments of the disclosure apparent, the technical solutions of the embodiment of the disclosure will be described in a clearly and fully understandable way in connection with the drawings related to the embodiments of the disclosure. It is obvious that the described embodiments are just a part but not all of the embodiments of the disclosure. Based on the described embodiments of the disclosure herein, those skilled in the art can obtain all other embodiment(s), without any inventive work, which should be within the scope of the disclosure.

Film packaging is divided into single-layer film packaging and multi-layer film packaging. Whether the single-layer film packaging or the multi-layer film packaging aims to block damage of water and oxygen to an OLED device and prolong the service life of the OLED device. However, a deposited film has a relatively high stress which is difficult to release, and particularly for an inorganic film, existence of the stress may cause the film to fracture, which disadvantageously influences a packaging effect.

Specific technologies or conditions unspecified in the embodiments refer to technologies or conditions described in literature in the art or will be performed according to the product disclosure. All adopted reagents or instruments unspecified with manufacturers are conventional products which can be purchased from market.

Figure 1:
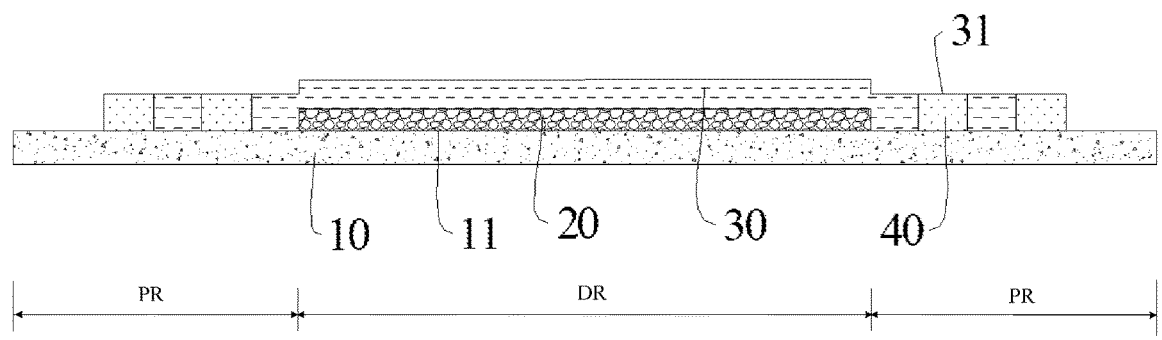
FIG. 1 is a structural schematic diagram of an organic light-emitting display panel in one embodiment of the present disclosure.

An embodiment of the present disclosure provides an organic light-emitting display panel. According to the embodiment of the present disclosure, with reference to FIG. 1, the organic light-emitting display panel includes: a base substrate 10; a plurality of OLED devices 20, the plurality of OLED devices 20 being arranged on a first surface 11 of the base substrate 10; a first packaging film 30, the first packaging film 30 being arranged on the first surface 11 and covering the OLED devices 20, and the first packaging film 30 having at least one opening 31 therein; and a second packaging film 40, filled in the opening 31. In FIG. 1, the plurality of OLED devices 20 are shown as one whole body.

Figure 10:
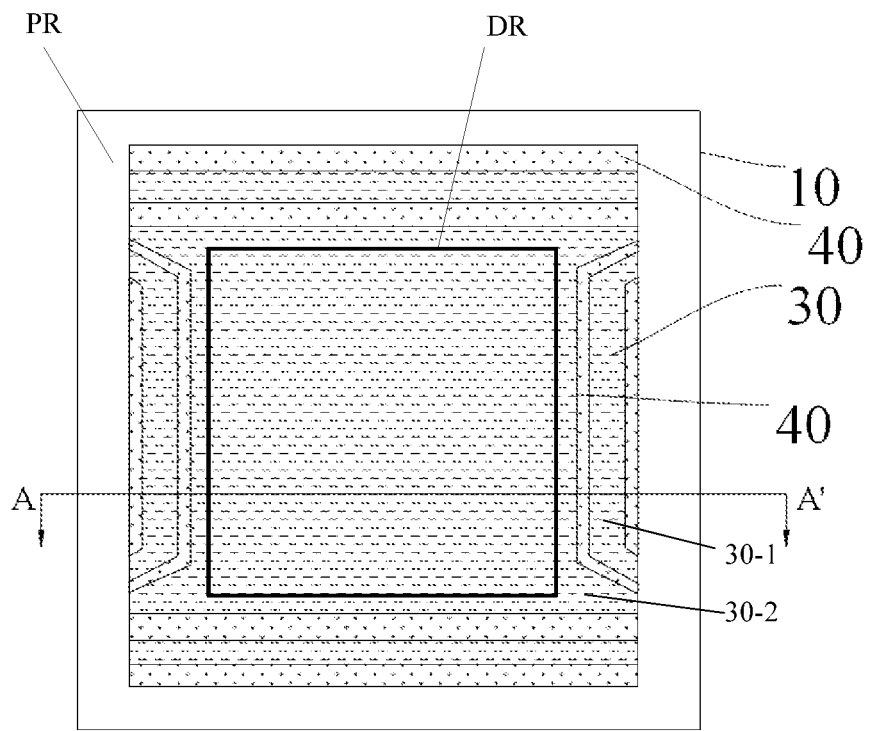

In a plane graph shown in FIG. 10 (FIG. 1 is a sectional view of an AA' position in FIG. 10), the organic light-emitting display panel can be divided into a display region DR and a peripheral region (non-display region) PR surrounding the display region AA. The plurality of OLED devices 20 are all located in the display region DR. The at least one opening 31 is located in the peripheral region PR. The first packaging film 30 is simultaneously located in the display region AA and the peripheral region PR.

For example, with reference to FIG. 1, in a direction perpendicular to the base substrate 10, the at least one opening 31 passes through the first packaging film.

For example, with reference to FIG. 10, the at least one opening 31 divides the first packaging film 30 into at least two sub portions 30-1 and 30-2, and the at least two sub portions 30-1 and 30-2 are made of the same material and are separated from each other.

For example, with further reference to the plane graph in FIG. 10, the at least one opening 31 is of a strip shape, and at least a portion of the at least one opening 31 is in parallel to an edge of the display region DR of the organic light-emitting display panel.

Therefore, the first packaging film and the second packaging film cover the OLED devices in a splicing mode, so that stress in the first packaging film and the second packaging film can be effectively released and the first packaging film and the second packaging film are prevented from being fractured, thereby improving the packaging effect and prolonging the service lives of the OLED devices.

According to the embodiments of the present disclosure, the specific type of the base substrate is not particularly limited. In some embodiments of the present disclosure, the specific types of the base substrate include, but are not limited to, a glass base substrate, a polymer base substrate or a metal base substrate and the like.

It should be noted that the word "OLED device" herein means an OLED device merely including a cathode, an anode and a light-emitting layer arranged between the cathode and the anode, or an OLED device including a cathode, an anode, a light-emitting layer arranged between the cathode and the anode, and at least one of an electron injection layer, an electron transport layer, a hole transport layer or a hole injection layer, wherein the electron injection layer and the electron transport layer are arranged between the cathode and the light-emitting layer, and the hole transport layer and the hole injection layer are arranged between the anode and the light-emitting layer.

According to the embodiments of the present disclosure, the opening can be defined by the first packaging film, and can also be defined by the first packaging film and a structure adjacent to the first packaging film.

According to the embodiments of the present disclosure, positions, sizes, number and shapes of the openings are not particularly limited. In some embodiments of the present disclosure, with reference to FIG. 1, an orthogonal projection of the openings 31 on the base substrate 10 does not overlap with that of the OLED devices on the base substrate. Therefore, due to the relatively high stress of the packaging film at the position of a non-display region (i.e., a region where the orthogonal projection on the base substrate does not overlap with that of the OLED device on the base substrate), the opening is formed in the non-display region, so as to effectively release the stress in the first packaging film and the second packaging film, and prevent a fracturing phenomenon of the first packaging film and the second packaging film, so that the packaging effect of the OLED devices is improved and the OLED devices are not influenced by water and oxygen. In some other embodiments of the present disclosure, the opening can also be formed in the display region, i.e., the orthogonal projection of the opening on the base substrate overlaps with that of the OLED device on the base substrate, which can also take an effect of reducing the stress of the first packaging film and the second packaging film. In some embodiments of the present disclosure, the number of the openings can be 2, 3, 4 (as shown in FIG. 1), 5, 6, 7, 8 and the like, and those skilled in the art can flexibly select. In some embodiments of the present disclosure, the shape of the opening can be rectangle, circle and regular or irregular polygon, and the present disclosure has no limitation thereto.

Figure 2:
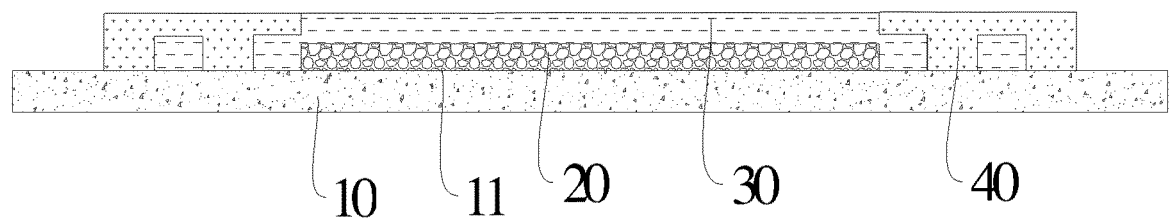
FIG. 2 is a structural schematic diagram of an organic light-emitting display panel in another embodiment of the present disclosure.

According to the embodiments of the present disclosure, a size of the second packaging film is not limited. In some embodiments of the present disclosure, with reference to FIG. 1, the second packaging film just fills up the opening. In some other embodiments of the present disclosure, with reference to FIG. 2, the second packaging film 40 extends to outside of the opening 31, i.e., an orthogonal projection of the first packaging film 30 on the base substrate overlaps with that of the second packaging film 40 on the base substrate. Therefore, when the stress existing in the first packaging film and the second packaging film are released, the second packaging film extends out of the opening, to cover a spliced position between the first packaging film and the second packaging film and close to the base substrate, so as to lengthen a path for vapor and oxygen outside to enter the OLED device, improve the packaging effect, and prolong the service life of the OLED device.

According to the embodiments of the present disclosure, in order to further block damage of vapor and oxygen to the OLED device, both the first packaging film and the second packaging film are inorganic films. Therefore, the blocking effect on vapor and oxygen is enhanced. In the embodiments of the present disclosure, a specific material for forming the inorganic film is not limited. In some embodiments of the present disclosure, the inorganic films include, but are not limited to, materials of SiNx, silicon dioxide, silicon carbide, zinc oxide or aluminium oxide and the like. Therefore, the inorganic film is wide in source, low in cost and excellent in using effect.

According to the embodiments of the present disclosure, a specific method for forming the first packaging film and the second packaging film is not limited. In some embodiments of the present disclosure, the specific methods for forming the first packaging film and the second packaging film include, but are not limited to, Chemical Vapor Deposition (CVD), sputtering, atomic layer deposition and the like. Therefore, the method is matured and easy to operate.

Figure 3:
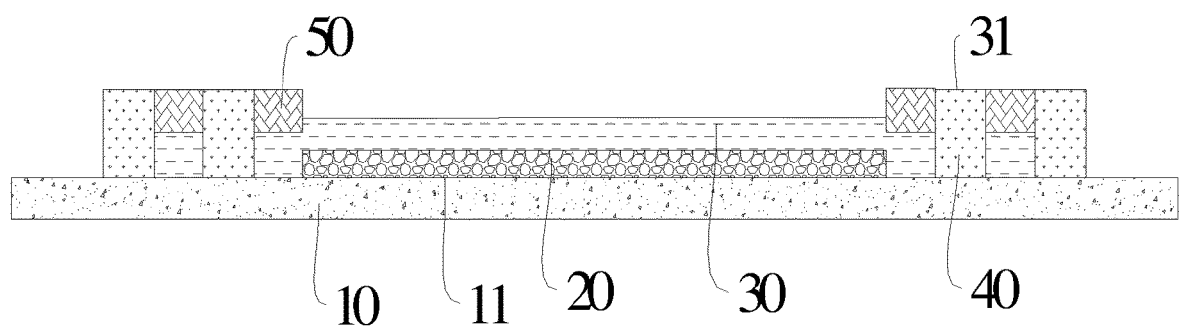
FIG. 3 is a structural schematic diagram of an organic light-emitting display panel in yet another embodiment of the present disclosure.
Figure 4:
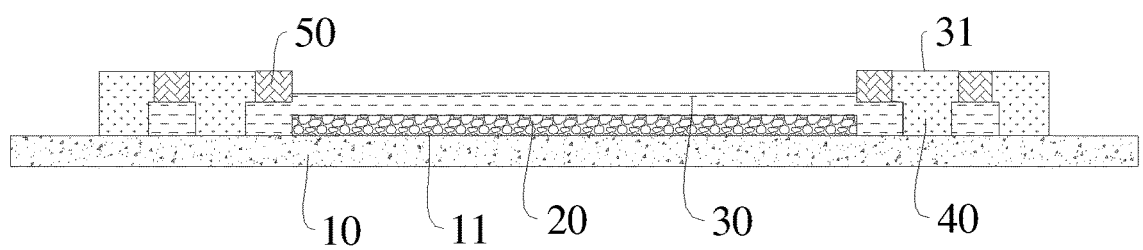
FIG. 4 is a structural schematic diagram of an organic light-emitting display panel in yet another embodiment of the present disclosure.

According to the embodiments of the present disclosure, in order to further block vapor and oxygen from entering the OLED device when the stress in the packaging film is released, with reference to FIG. 3 and FIG. 4, a thickness of the second packaging film 40 is greater than that of the first packaging film 30, and a desiccant 50 is arranged on the side of the first packaging film 30 facing away from the base substrate 10. Therefore, when the stress existing in the packaging film is released, arrangement of the desiccant can further block vapor and oxygen from entering the OLED device, so that the path for vapor and oxygen to permeate the OLED device is lengthened, and the service life of the OLED device is prolonged.

According to the embodiments of the present disclosure, a specific type of the desiccant is no limited. In some embodiments of the present disclosure, types of the desiccant include, but are not limited to, substances capable of absorbing water, such as calcium oxide, magnesium oxide, copper sulfate and the like. Therefore, the desiccant is excellent in drying effect, low in cost and wide in source.

According to the embodiments of the present disclosure, a thickness relationship among the first packaging film, the desiccant and the second packaging film is not limited. In some embodiments of the present disclosure, a sum of the thicknesses of the first packaging film and the desiccant is equal to the thickness of the second packaging film. Therefore, a packaging structure of the OLED device is smoother so as to facilitate operation of subsequent steps of the OLED device. In the embodiments of the present disclosure, the thickness of the second packaging film is 1.6 to 2.4 micrometers, and the thickness of the first packaging film is 0.6 to 1.4 micrometers. Therefore, the packaging film not only can well block vapor and oxygen from permeating the OLED device, but also will not make the organic light-emitting display panel too thick to influence the requirement on lighting and thinning of the organic light-emitting display panel.

Figure 5:
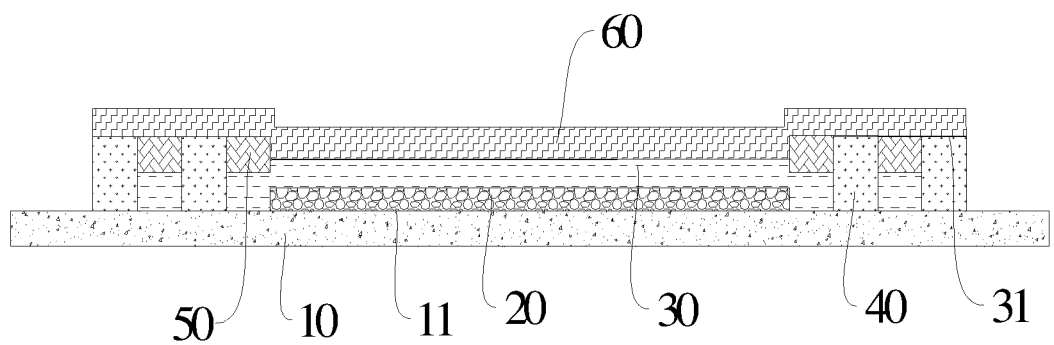
FIG. 5 is a structural schematic diagram of an organic light-emitting display panel in yet another embodiment of the present disclosure.

According to an embodiment of the present disclosure, the organic light-emitting display panel further includes: a third packaging film 60. The third packaging film 60 covers the first packaging film 30 and the second packaging film 40. The third packaging film 60 is an organic film (with reference to FIG. 5) or a stack of multiple layers of alternatively arranged organic films and inorganic films (not shown). Therefore, flatness and the packaging effect of an OLED device film packaging structure can be improved.

According to the embodiments of the present disclosure, when the organic light-emitting display panel includes multiple inorganic films, at least one of the inorganic films is the above-mentioned packaging film formed in the splicing mode.

According to the embodiments of the present disclosure, a material and method for forming the organic film is not limited. In some embodiments of the present invention, the material for forming the organic film includes, but is not limited to, materials of polyacrylate, polymethacrylate and the like, and the method for forming the organic film includes, but is not limited to, methods of ink jetting, printing or printing and the like. Therefore, the using effect is excellent, and the method is simple to operate and matured.

Figure 11:
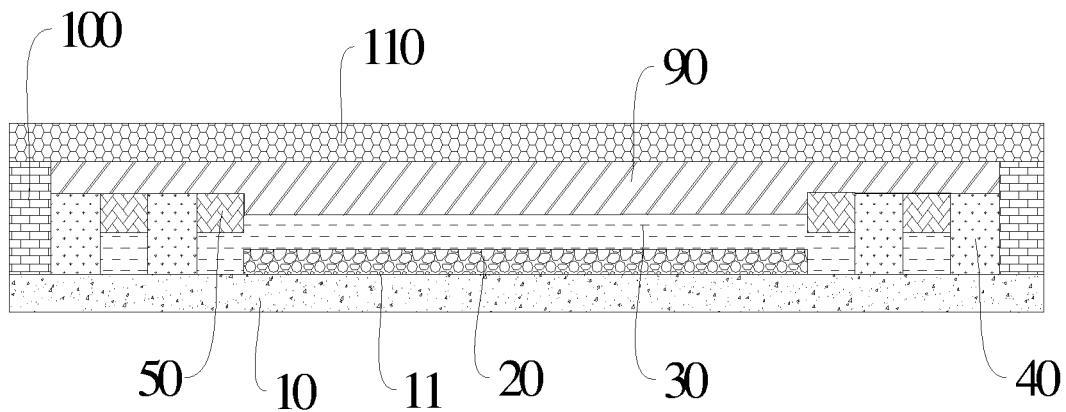
FIG. 11 is a structural schematic diagram of an organic light-emitting display panel in yet another embodiment of the present disclosure.

According to an embodiment of the present disclosure, with reference to FIG. 11, the organic light-emitting display panel can further include a filling layer 90, arranged on a side of the first packaging film 30 and the second packaging film 40 facing away from the base substrate 10, and covering the desiccant 50; a sealant 100, arranged on a peripheral edge of a display apparatus; and a substrate 110, the substrate 110 being arranged on a side of the filling layer 90 of the organic light-emitting display panel facing away from the base substrate 10, and covering the filling layer and the substrate 10. Therefore, using functions of the display apparatus can be achieved.

According to the embodiments of the present disclosure, materials and methods for forming the filling 90, the sealant 100 and the substrate 110 are not limited.

Figure 6:
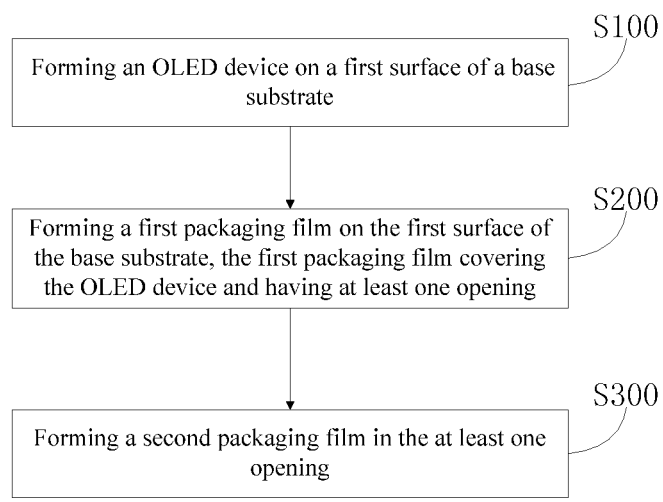
FIG. 6 is a flow schematic diagram of fabricating an organic light-emitting display panel in yet another embodiment of the present disclosure.

In another aspect of the present disclosure, the present disclosure provides a method for fabricating an organic light-emitting display panel. According to an embodiment of the present disclosure, with reference to FIG. 6, the method includes:

S100: forming an OLED device on a first surface of a base substrate.

S200: forming a first packaging film 30 on the first surface of the base substrate 10, the first packaging film 30 covering the OLED device and having at least one opening 31.

Figure 7:
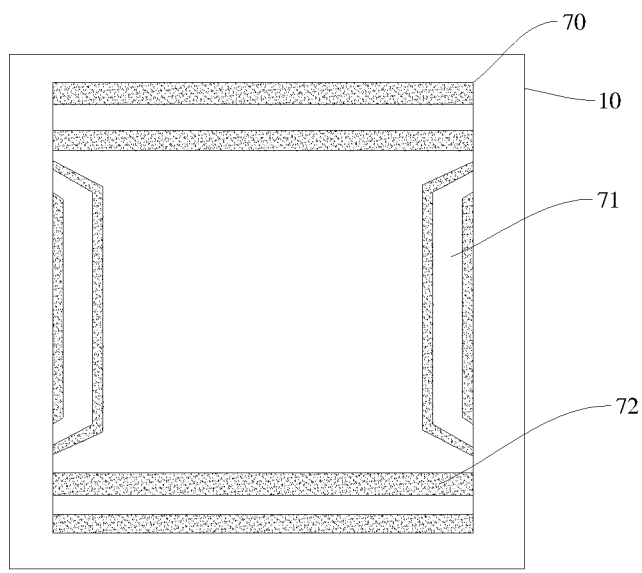
FIG. 7 to FIG. 10 are flow structural schematic diagrams of fabricating an organic light-emitting display panel in yet another embodiment of the present disclosure.

According to an embodiment of the present disclosure, with reference to FIG. 7, by a first mask 70, the first packaging film 30 is deposited at a position corresponding to a gap 71 of the first mask, the first packaging film 30 covers the OLED device, and at least one opening 31 is formed at a position corresponding to a non-gap position 72 of the first mask. Thus, the first packaging film is formed. For a structural schematic diagram after the first mask is removed, please refer to FIG. 8.

S300: forming a second packaging film 40 in the at least one opening 31.

Figure 9:
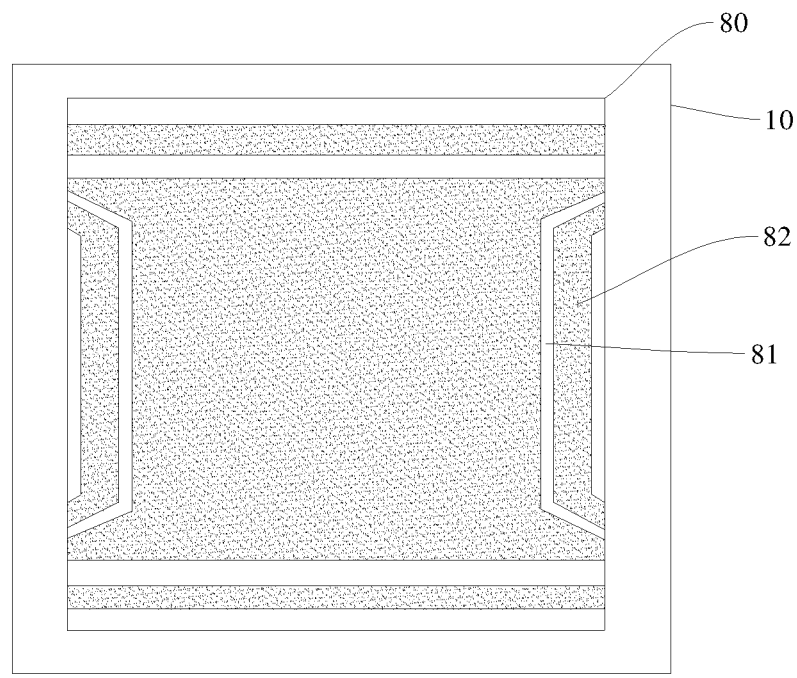

According to an embodiment of the present disclosure, with reference to FIG. 9, by a second mask 80, the second packaging film 40 is deposited at a position corresponding to a gap 81 of the second mask 80. The gap 81 of the second mask 80 corresponds to the non-gap position 72 of the first mask, that is, The gap 81 of the second mask 80 corresponds to the at least one opening 31 of the first packaging film 30. The first packaging film 30 is covered at a non-gap position 82 so as to obtain the second packaging film 40 formed in the opening 31. Therefore, a film packaging structure formed by the first packaging film and the second packaging film in a splicing mode can be obtained, and for a structural schematic diagram, please refer to FIG. 10 and FIG. 1.

According to the embodiments of the present disclosure, shapes of the first mask and the second mask are not limited, and the shape of the at least one opening 31 of the organic light-emitting display panel can be adjusted.

According to the embodiments of the present disclosure, the fabrication method is simple to operate, low in cost and easy for industrial production, the prepared film packaging structure covers the OLED device by the first packaging film and the second packaging film in the splicing mode, stress in the first packaging firm and the second packaging film can be effectively released, and the first packaging film and the second packaging film are prevented from being fractured, so that the packaging effect is improved, and the service life of the OLED device is prolonged.

According to the embodiments of the present disclosure, the method can be used for fabricating the above-mentioned organic light-emitting display panel; the materials, the methods and the like for forming the first packaging film and the second packaging film are consistent with the above, which will not be repeated herein.

According to the embodiments of the present disclosure, in order to further block vapor and oxygen from entering the OLED device when the stress existing in the packaging films are released, with reference to FIG. 3 and FIG. 4, the thickness of the second packaging film 40 is greater than that of the first packaging film 30, and the method further includes: providing a desiccant 50 on a side of the first packaging film 30 facing away from the base substrate. Therefore, when the stress existing in the packaging films are released, arrangement of the desiccant can further block vapor and oxygen from entering the OLED device, lengthen a path for vapor and oxygen to permeate the OLED device and prolong the service life of the OLED device.

According to the embodiments of the present disclosure, the types of the desiccant are consistent with the above, which will not be repeated herein.

In yet another aspect of the present disclosure, the present disclosure provides a display apparatus. According to the embodiment of the present disclosure, the display apparatus includes the above-mentioned organic light-emitting display panel. Therefore, the service life of the display apparatus can be prolonged.

According to the embodiment of the present disclosure, the specific type of the display apparatus is not specially limited, the display apparatus may be any apparatus and device with a display function in the art, and for example, the display apparatus includes, but are not limited to, a mobile phone, a tablet personal computer, a computer display, a game console, a television, a display screen, a wearable device, other household electric appliances or domestic appliances with the display function and the like.

Certainly, those skilled in the art can understand that besides the above-mentioned organic light-emitting display panel, the display apparatus of the present disclosure can further include necessary structures and parts which a conventional display apparatus has. By taking the mobile phone as an example, it is illustrated that besides the organic light-emitting display panel of the present disclosure, the display apparatus further can be provided with structures and parts which a conventional mobile phone, such as a touch screen, a housing, a CPU, a shooting module, a fingerprint identification module, a sound processing system and the like, which is not repeated herein.

Figure 8:
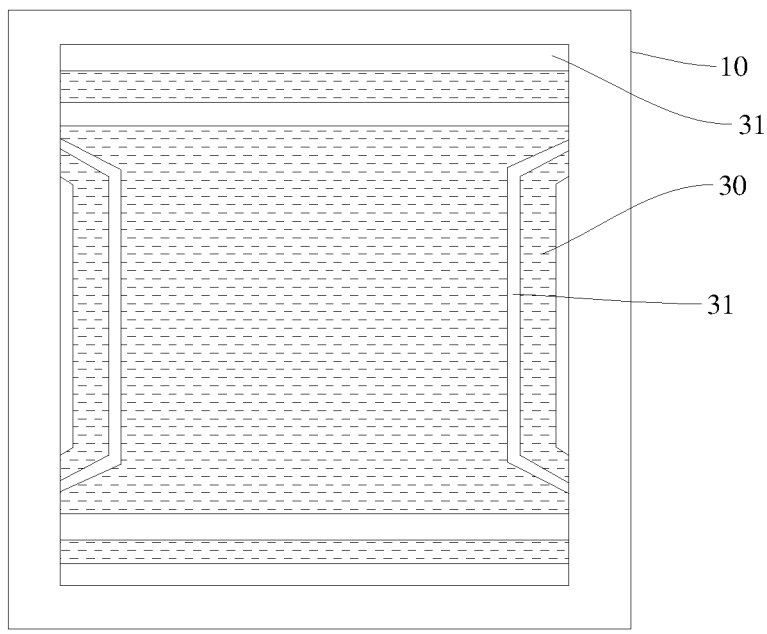

A method for fabricating an organic light-emitting display panel, which is provided by an embodiment of the present disclosure, includes:

S1: forming an OLED device on a first surface of a base substrate;

S2: with reference to FIG. 7, on the base substrate obtained in step S1, depositing a first packaging film 30 with a thickness of 1 micrometer at a position corresponding to a gap 71 of a first mask, so that the first packaging film 30 covers the OLED device, and at least one opening 31 is formed at a position corresponding to a non-gap position of the first mask, wherein, for a structural schematic diagram after the first mask is removed, please refer to FIG. 8;

S3: with reference to FIG. 9, on the base substrate obtained in step S2, depositing a second packaging film 40 at a position corresponding to a gap 81 of the second mask 80, wherein, the gap 81 of the second mask 80 corresponds to the non-gap position 72 of the first mask, that is, gap 81 of the second mask 80 corresponds to the at least one opening 31 of the first packaging film 30. The first packaging film 30 is covered by the non-gap position 82, and the second packaging film 40 with a thickness of 2 micrometers is formed in the opening 31. The structural schematic diagram can refer to FIG. 10; and S4: on the basis of the base substrate obtained in step S3, providing a desiccant 50 on a side of the first packaging film 30 facing away from the base substrate. The structural schematic diagram can refer to FIG. 3.

Due to a film packaging structure obtained by the embodiment and formed by the first packaging film and the second packaging film in a splicing mode, stress in the first packaging film and the second packaging film can be effectively released and fracture of the first packaging film and the second packaging film is prevented, and due to addition of the desiccant, vapor and oxygen are absorbed by the desiccant, a path for vapor and oxygen to permeate the OLED device is lengthened, and a packaging effect of the OLED device is improved.

Figure 12:
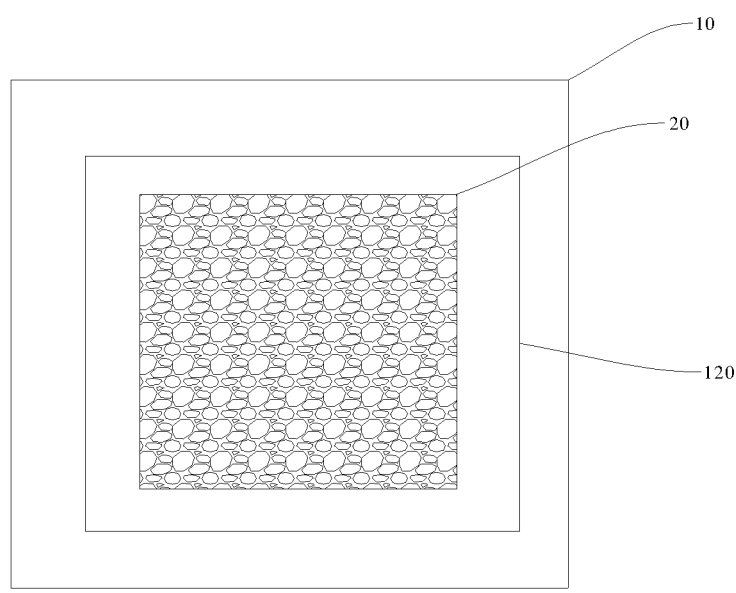
FIG. 12 to FIG. 17 are flow structural schematic diagrams of fabricating an organic light-emitting display panel in an embodiment of the present disclosure.
Figure 13:
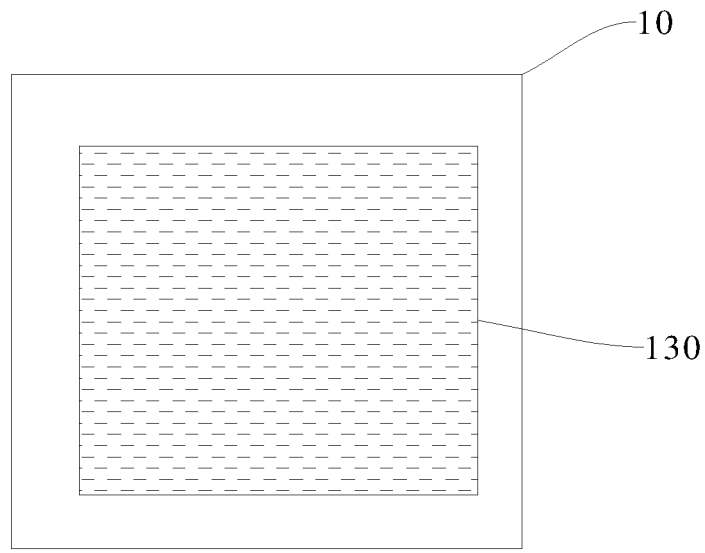
Figure 14:
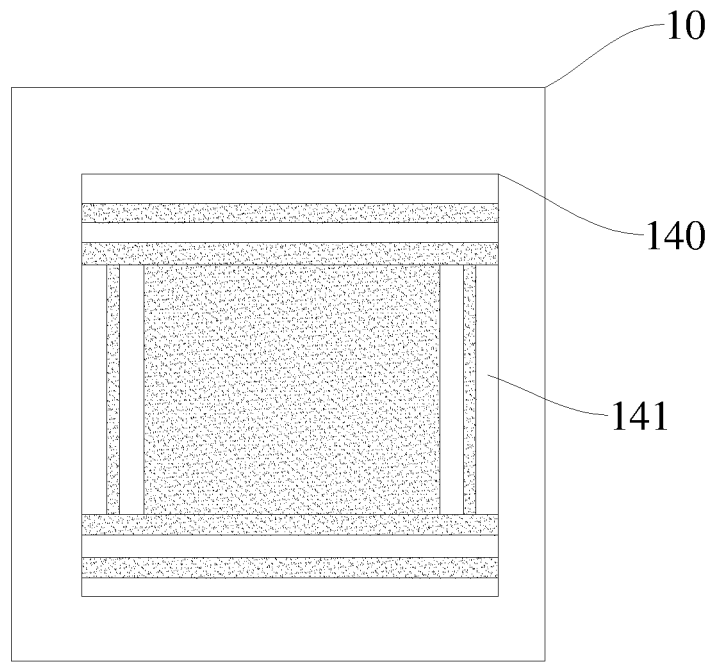
Figure 15:
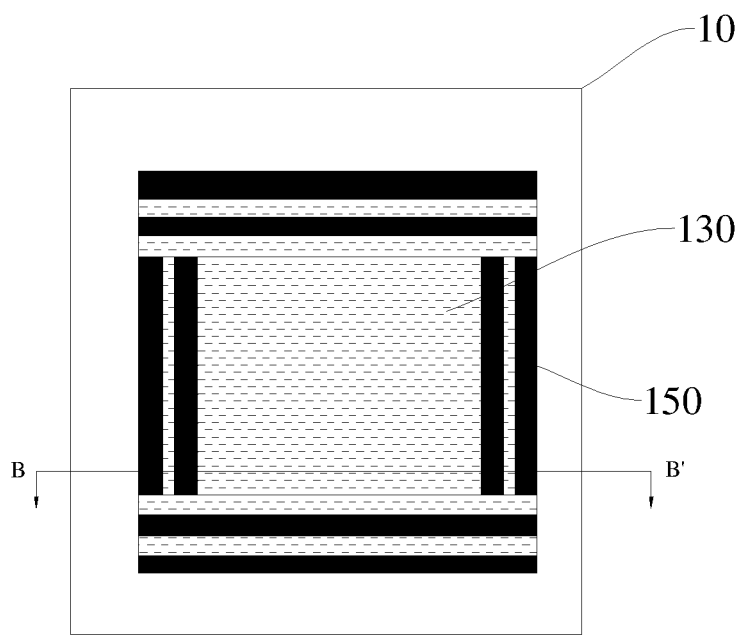
Figure 16:
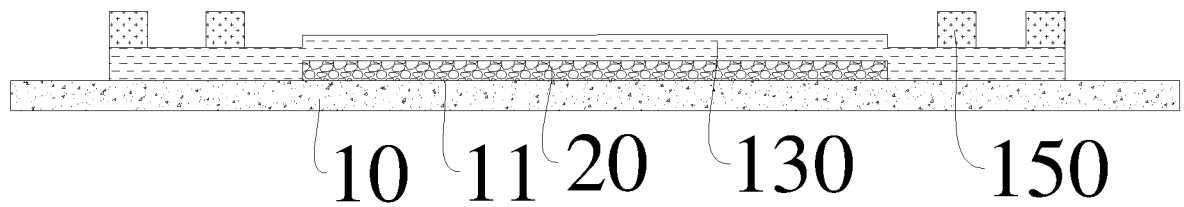
Figure 17:
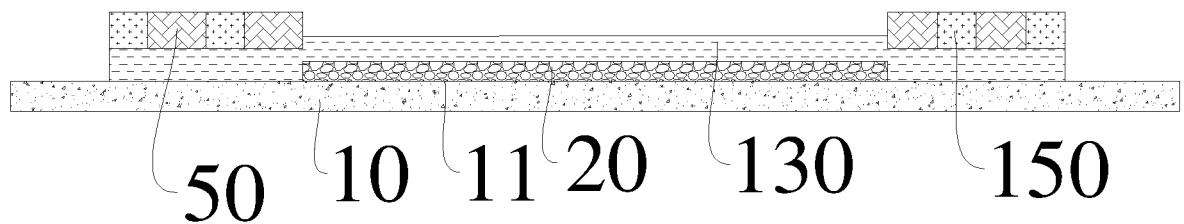

A method for fabricating an organic light-emitting display panel, which is provided by another embodiment of the present disclosure, includes:

S1: forming an OLED device 20 on a first surface of a base substrate;

S2: with reference to FIG. 12, on the base substrate obtained in step S1, depositing a fourth packaging film 130 with a thickness of 1 micrometer by a third mask 120. No opening is formed in the fourth packaging film 130. The fourth packaging film 130 covers the OLED device. For a structural schematic diagram after the third mask is removed, please refer to FIG. 13;

S3: with reference to FIG. 14, on the basis of the base substrate obtained in step S2, depositing a fifth packaging film 150 with a thickness of 1 micrometer at a position corresponding to a gap 141 of a fourth mask 140. Therefore, the packaging film at the gap has a thickness of 2 micrometers, wherein, for a structural schematic diagram, please refer to FIG. 15 and FIG. 16 (FIG. 16 is a sectional view of a BB' position in FIG. 15); and S4: on the basis of the base substrate obtained in step S2, providing a desiccant 50 on a side of the fourth packaging film 30 facing away from the base substrate, wherein, for a structural schematic diagram, please refer to FIG. 17.

In the embodiment, due to existence of an opening in the fifth packaging film 150, an internal stress of the fifth packaging film 150 can be released. Due to addition of the desiccant, vapor and oxygen are absorbed by the desiccant, a path for vapor and oxygen to permeate the OLED device is lengthened, and a packaging effect of the OLED device is improved.

In addition, words such as "first" and "second" are only used for description, but should not be understood as denotation or suggestion on relative importance or implicit indication on the number of indicated technical features. Therefore, features defined as "first" and "second" can explicitly or implicitly include one or more of the features. In the description of the present disclosure, the phrase "a plurality of" indicates that there are two or more than two, unless otherwise defined.

In the description of the disclosure, description of reference words such as "one embodiment", "some embodiments", "example", "specific example", or "some examples" and the like implies that the specific features, structures, materials or characteristics described by combining the embodiments or examples are included in at least one embodiment or example of the present disclosure. In the disclosure, schematic expressions on the words are not necessary to aim at the same embodiment or example. Moreover, the described specific features, structures, materials or characteristics can be integrated in a proper mode in any one or more embodiments or examples. Moreover, in a case of no mutual contradiction, those skilled in the art can carry out integration and combination on different embodiments or examples and features of different embodiments or examples, which are described in the disclosure.

The above has shown and described the embodiments of the present disclosure, but it can be understood that the foregoing embodiments are exemplary and are not intended to define the present disclosure, and those skilled in the art can make changes, modifications, replacements and variations to the foregoing embodiments in the scope of the present disclosure. The scope of the present disclosure is determined by the appended claims.

The invention claimed is:

1. An organic light-emitting display panel with a display region and a non-display region surrounding the display region in a plan view, comprising:
   a base substrate;
   a plurality of Organic Light-emitting Diode (OLED) devices, located on the base substrate and in the display region; and
   a first packaging film, located in both the display region and the non-display region, wherein the plurality of OLED devices are located between the first packaging film and the base substrate, and at least one opening is located in the first packaging film, in a direction perpendicular to the base substrate, the at least one opening runs through the first packaging film,
   the organic light-emitting display panel further comprises a second packaging film, wherein at least a part of the second packaging film is filled in the at least one opening, in the direction perpendicular to the base substrate, the second packaging film extends to outside of the at least one opening, a desiccant is filled in a region between a portion of the second packaging film extending from the at least one opening and the display region and both the first packaging film and the second packaging film are inorganic films.

2. The organic light-emitting display panel according to claim 1, wherein the at least one opening divides the first packaging film into at least two sub portions, and the at least two sub portions are made of a same material and separated from each other.

3. The organic light-emitting display panel according to claim 1, wherein in the plan view, the at least one opening is of a strip shape, and at least a portion of the at least one opening is in parallel to an edge of the display region of the organic light-emitting display panel.

4. The organic light-emitting display panel according to claim 1, wherein the at least one opening is located in the non-display region.

5. The organic light-emitting display panel according to claim 1, wherein a thickness of the second packaging film is greater than that of the first packaging film, and the desiccant is arranged on one side of the first packaging film, which faces away from the base substrate.

6. The organic light-emitting display panel according to claim 5, wherein the thickness of the second packaging film is 1.6 to 2.4 micrometers, the thickness of the first packaging film is 0.6 to 1.4 micrometers.

7. The organic light-emitting display panel according to claim 1, further comprising:
   a third packaging film, the third packaging film covering the first packaging film and the second packaging film, and the third packaging film being an organic film or a laminated layer of a plurality of organic films and a plurality of inorganic films.

8. A display apparatus, comprising the organic light-emitting display panel according to claim 1.

9. An organic light-emitting display panel with a display region and a non-display region surrounding the display region in a plan view, comprising:
   a base substrate;
   a plurality of Organic Light-emitting Diode (OLED) devices, located on the base substrate and in the display region; and
   a first packaging film, located in both the display region and the non-display region, wherein the plurality of OLED devices are located between the first packaging film and the base substrate, and at least one first opening is located in the first packaging film, in a direction perpendicular to the base substrate, the at least one first opening runs through the first packaging film,
   the organic light-emitting display panel further comprises a second packaging film, wherein at least a part of the second packaging film is filled in the at least one first opening, in the direction perpendicular to the base substrate, the second packaging film extends to outside of the at least one first opening, and both the first packaging film and the second packaging film are inorganic films, in the plan view, the at least one first opening has a fold line shape comprising a first part parallel to an edge of the display region and two second parts extending from each of the two ends of the first part to a boundary of the first packaging film parallel to the edge of the display region, respectively, the first part and the two second parts are interconnected to each other and forms a substantially trapezoidal shape with the boundary of the first packaging film.

10. The organic light-emitting display panel according to claim 9, wherein two of the at least one first openings are located in the first packaging film and the two of the at least one first opening are symmetric with respect to a center of the display panel.

11. The organic light-emitting display panel according to claim 10, further comprising at least one second opening, located on the boundary of the first packing film parallel to the edge of the display region, wherein the at least one second opening is parallel to the edge of the display region and is not out of a range of a projection of the at least one first opening on the boundary of the first packaging.

12. The organic light-emitting display panel according to claim 11, further comprising at least one third opening and at least one fourth opening, wherein the display region has a rectangle shape, two opposite sides of the display region are provided with the at least one first opening and the at least one second opening, and the other two opposite sides of the display region are provided with the at least one third opening and the at least one fourth opening, and the at least one third opening is located on the boundary of the first packaging film.

13. The organic light-emitting display panel according to claim 12, wherein the at least one first opening and the at least one second opening provided on the two opposite sides of the display region do not overlap, and the at least one third opening and the at least one fourth opening provided on the other two opposite sides of the display region do not overlap, each of the at least one second opening, the at least one third opening and the at least one fourth opening extend to a boundary of the first packaging film, and the second packaging film filled in the at least one first opening, the at least one second opening, the at least one third opening, and the at least one fourth opening, and the second packaging film and the second packaging film on a periphery of the first packaging film are connected to an integral body.

14. A method for fabricating an organic light-emitting display panel with a display region and a non-display region surrounding the display region in a plan view, comprising:
   forming a plurality of OLED devices on a base substrate and in the display region; and
   forming a first packaging film on the base substrate, the first packaging film being located in the display region and the non-display region, at least one opening being located in the first packaging film, in a direction perpendicular to the base substrate, the at least one opening runs through the first packaging film,
   the method further comprises forming a second packaging film, wherein at least a part of the second packaging film is filled in the at least one opening, in the direction perpendicular to the base substrate, the second packaging film extends to outside of the at least one opening, a desiccant is filled in a region between a portion of the second packaging film extending from the at least one opening and the display region and both the first packaging film and the second packaging film are inorganic films.

15. The method according to claim 14, wherein in a direction perpendicular to the base substrate, a thickness of the second packaging film is greater than that of the first packaging film, the method further comprising:
   providing the desiccant on a side of the first packaging film facing away from the base substrate.

16. A method for fabricating an organic light-emitting display panel with a display region and a non-display region surrounding the display region in a plan view, comprising:
   forming a plurality of OLED devices on a base substrate and in the display region; and
   forming a first packaging film on the base substrate, the first packaging film being located in the display region and the non-display region, at least one first opening being located in the first packaging film, in a direction perpendicular to the base substrate, the at least one first opening runs through the first packaging film,
   the method further comprises forming a second packaging film using a mask with a gap to partially cover the at least one first opening, wherein at least a part of the second packaging film is filled in the at least one first opening, in the direction perpendicular to the base substrate, the second packaging film extends to outside of the at least one first opening, and both the first packaging film and the second packaging film are inorganic films, in the plan view, the at least one first opening has a fold line shape comprising a first part parallel to an edge of the display region and two second parts extending from each of the two ends of the first part to a boundary of the first packaging film parallel to the edge of the display region, respectively, the first part and the two second parts are interconnected to each other and forms a substantially trapezoidal shape with the boundary of the first packaging film.

17. The method according to claim 16, wherein two of the at least one first openings are located in the first packaging film and the two of the at least one first opening are symmetric with respect to a center of the display panel.

18. The method according to claim 17, further comprising forming at least one second opening, located on the boundary of the first packing film parallel to the edge of the display region, wherein the at least one second opening is parallel to the edge of the display region and is not out of a range of a projection of the at least one first opening on the boundary of the first packaging.

19. The method according to claim 18, further comprising forming at least one third opening and at least one fourth opening, wherein the display region has a rectangle shape, two opposite sides of the display region are provided with the at least one first opening and the at least one second opening, and the other two opposite sides of the display region are provided with the at least one third opening and the at least one fourth opening, and the at least one third opening is located on the boundary of the first packaging film.

20. The method according to claim 19, wherein the at least one first opening and the at least one second opening provided on the two opposite sides of the display region do not overlap, and the at least one third opening and the at least one fourth opening provided on the other two opposite sides of the display region do not overlap, each of the at least one second opening, the at least one third opening and the at least one fourth opening extend to a boundary of the first packaging film, and the second packaging film filled in the at least one first opening, the at least one second opening, the at least one third opening, and the at least one fourth opening, and the second packaging film and the second packaging film on a periphery of the first packaging film are connected to an integral body.

* * * * *